(12) United States Patent
Liu et al.

(10) Patent No.: US 7,298,001 B1
(45) Date of Patent: Nov. 20, 2007

(54) THREE-DIMENSIONAL CAPACITOR STRUCTURE

(75) Inventors: Li-Kuo Liu, Hsin-Chu (TW); Chien-Chia Lin, Kao-Hsiung (TW)

(73) Assignee: JMicron Technology Corp., Hsin-Chu (TW)

( * ) Notice: Subject to any disclaimer, the term of this patent is extended or adjusted under 35 U.S.C. 154(b) by 0 days.

(21) Appl. No.: 11/468,296

(22) Filed: Aug. 29, 2006

(30) Foreign Application Priority Data

Feb. 16, 2006 (TW) .............................. 95105274 A (51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/306; 257/307; 257/308; 257/309

(58) Field of Classification Search ........ 257/306–309, 257/534
See application file for complete search history.

(56) References Cited

U.S. PATENT DOCUMENTS

| | | | |
|---|---|---|---|
| 5,583,359 A | 12/1996 | Ng et al. | |
| 6,570,210 B1* | 5/2003 | Sowlati et al. | 257/307 |
| 6,743,671 B2* | 6/2004 | Hu et al. | 438/253 |
| 6,822,312 B2* | 11/2004 | Sowlati et al. | 257/532 |
| 7,061,746 B2* | 6/2006 | Abdallah et al. | 361/301.4 |
| 7,161,204 B2* | 1/2007 | Lin et al. | 257/296 |
| 2006/0226462 A1* | 10/2006 | Ota | 257/298 |
| 2007/0117340 A1* | 5/2007 | Steltenpohl | 438/397 |

* cited by examiner

*Primary Examiner*—Anh Phung
*Assistant Examiner*—Allison P Bernstein
(74) *Attorney, Agent, or Firm*—Winston Hsu (57) ABSTRACT

A three-dimensional capacitor structure has a first conductive layer, a second conductive layer disposed above the first conductive layer, and a plug layer disposed therebetween. The first conductive layer includes a plurality of grid units arranged in a matrix, where in odd rows of the matrix, a first conductive grid is located in each odd column, and a first circular hole is located in each even column. Additionally, a first conductive island is located within each first circular hole. The pattern of the second conductive grids, the second circular holes, and the second conductive island of the second conductive layer is mismatched with that of the first conductive layer. The plug layer has a plurality of plugs disposed in between each first conductive island and each second conductive grid, and in between each first conductive grid and each second conductive island.

7 Claims, 10 Drawing Sheets

THREE-DIMENSIONAL CAPACITOR STRUCTURE

BACKGROUND OF THE INVENTION

1. Field of the Invention

The present invention relates to a capacitor structure, and more particularly, to a three-dimensional capacitor structure having low resistance and high matching.

2. Description of the Prior Art

Figure 1:
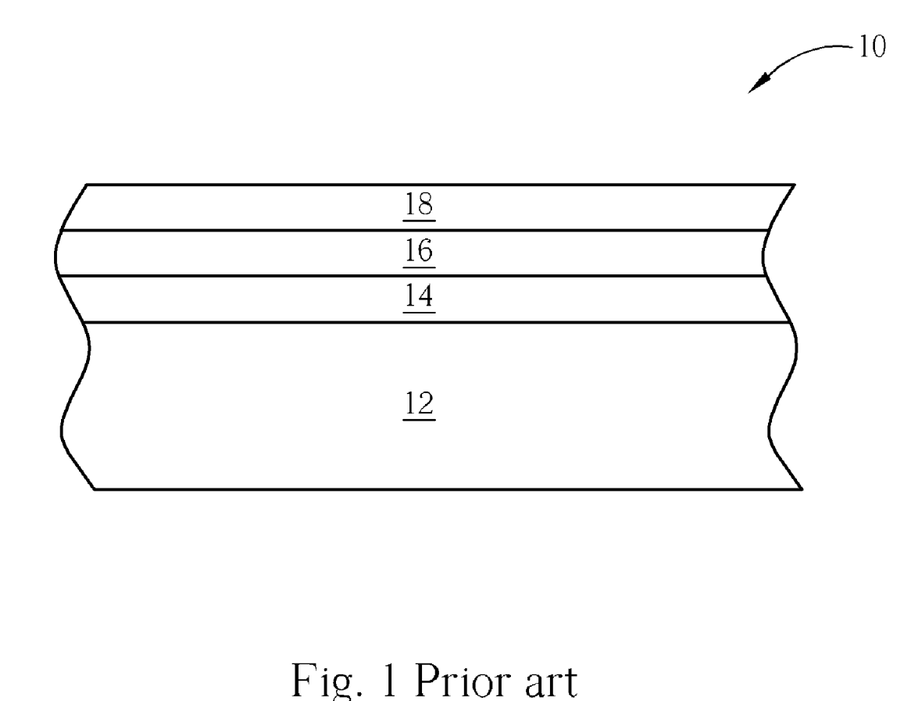
FIG. 1 is a schematic diagram of a metal-insulator-metal (MIM) capacitor structure according to the prior art.

Capacitor structures are able to store charges, and can be applied to many sorts of integrated circuits, such as RFIC and MMIC. A capacitor structure consists of two parallel electrical plates with an insulation layer between thereof. Please refer to FIG. 1. FIG. 1 is a schematic diagram of a metal-insulator-metal (MIM) capacitor structure according to the prior art. As FIG. 1 shows, the MIM capacitor structure 10 comprises a substrate 12, a first electrical plate 14 disposed on the substrate 12, a capacitor dielectric layer 16 located on the first electrical plate 14, and a second electrical plate 18 disposed on the capacitor dielectric layer 16.

Figure 2:
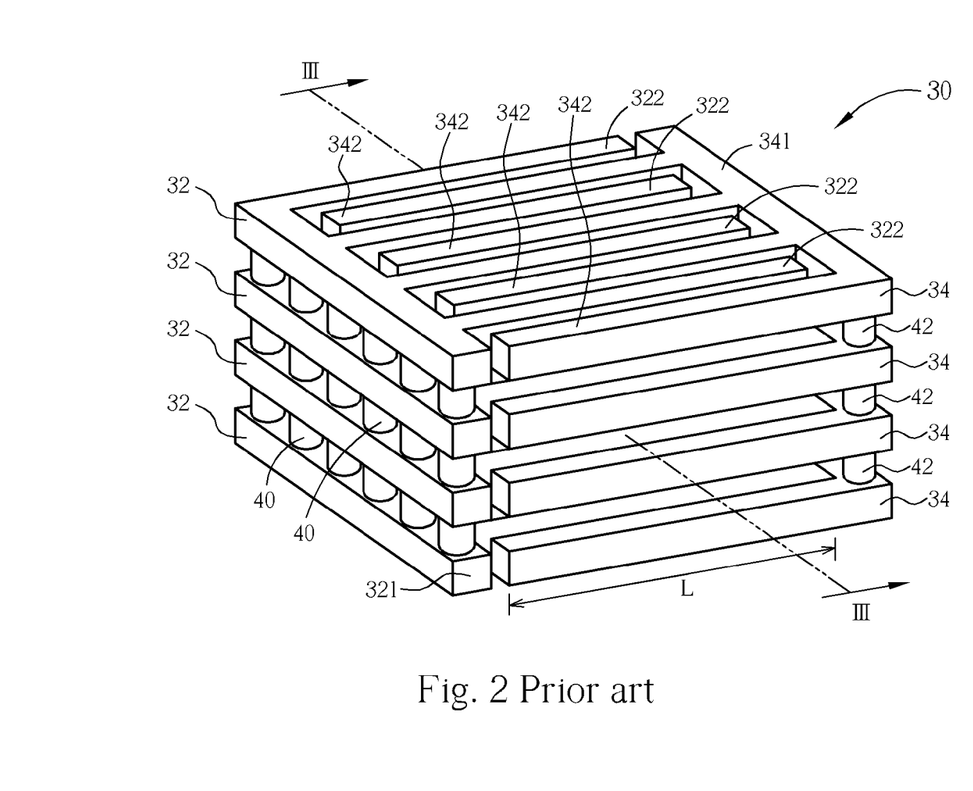
FIG. 2 is a schematic external diagram of a prior inter-digitated capacitor structure.
Figure 3:
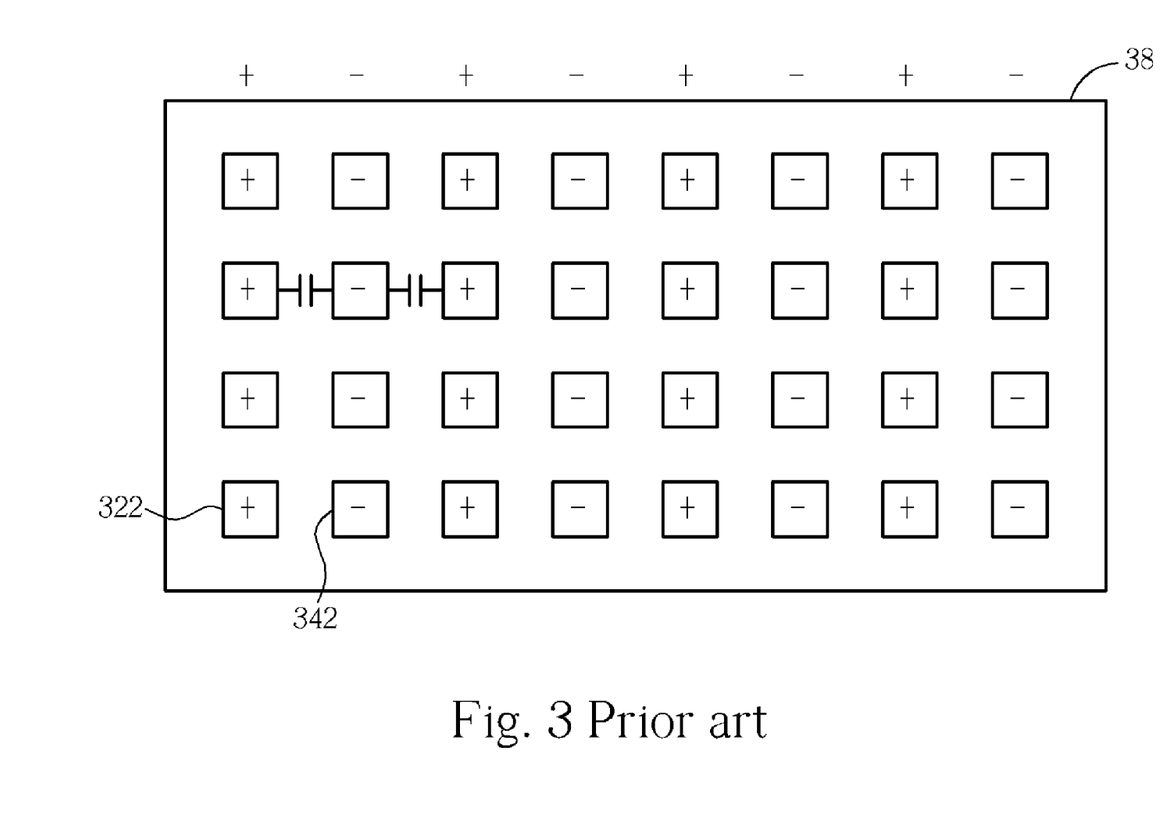
FIG. 3 is a schematic sectional diagram of the prior inter-digitated capacitor structure, taken across section III-III of FIG. 2.

An inter-digitated capacitor structure has been gradually replacing the conventional MIM capacitor structure. U.S. Pat. No. 5,583,359 discloses an inter-digitated capacitor structure. Please refer to FIGS. 2-3. FIG. 2 is a schematic external diagram of a prior art inter-digitated capacitor structure 30. FIG. 3 is a schematic sectional diagram of the prior art inter-digitated capacitor structure 30, taken across sections III-III of FIG. 2. As FIGS. 2-3 show, the prior inter-digitated capacitor structure 30 is composed of a first electrode structure and a second electrode structure. The first electrode structure comprises a plurality of first metal patterns 32 stacked vertically with respect to each other. The second electrode structure comprises a plurality of second metal patterns 34 stacked vertically with respect to each other. In addition, each first metal pattern 32 comprises a first peripheral part 321 and a plurality of first finger parts 322 connected to the first peripheral part 321. Each second metal pattern 34 comprises a second peripheral part 341 and a plurality of second finger parts 342 connected to the second peripheral part 341. Furthermore, a capacitor dielectric layer 38 (not shown in FIG. 2) is disposed between each first metal pattern 32 and each second metal pattern 34. The prior inter-digitated capacitor structure 30 further comprises a plurality of first connective plugs 40 disposed among the capacitor dielectric layers 38 between the first peripheral parts 321 of each first metal pattern 32, so every first metal pattern 32 electrically connects with each other. Additionally, there are a plurality of second connective plugs 42 disposed among the capacitor dielectric layer 38 between the second peripheral parts 341 of each second metal pattern 34, so every second metal pattern 34 electrically connects with each other.

As FIG. 2 shows, the first metal patterns 32 connected with each other by the first connective plugs 40 make up a first electrode structure. The second metal patterns 34 connected with each other by the second connective plugs 42 make up a second electrode structure. Furthermore, the first metal patterns 32, the second metal patterns 34, and the capacitor dielectric layer between the first metal patterns 32 and the second metal patterns 34 form the prior inter-digitated capacitor structure 30. As FIG. 3 shows, the first finger parts 322 of the first metal patterns 32 are connected to a positive voltage, and the second finger parts 342 of the second metal patterns 34 are connected to a negative voltage.

Figure 4:
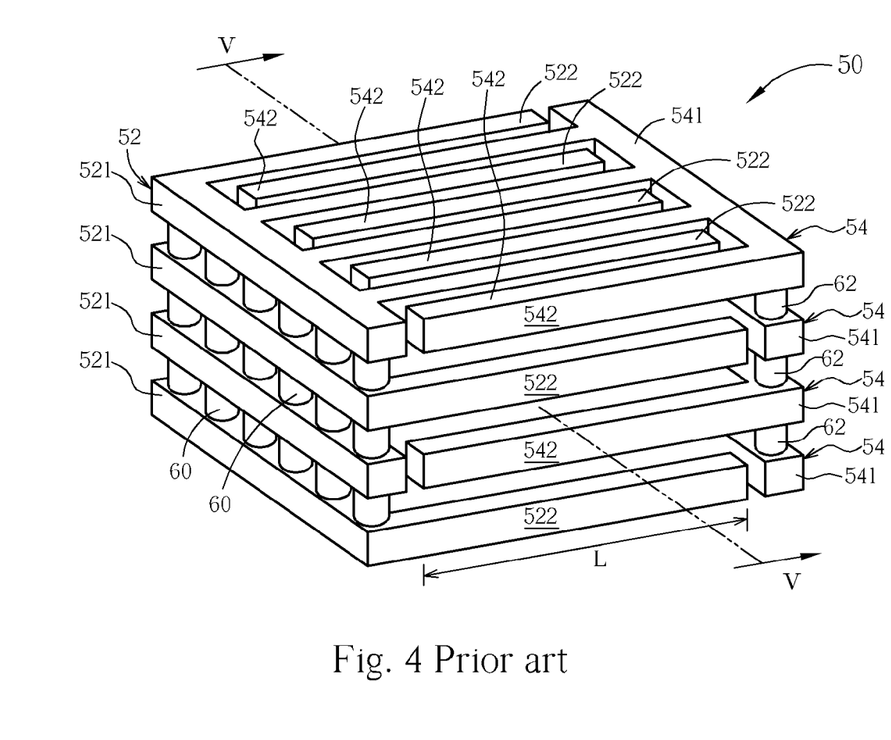
FIG. 4 is a schematic external diagram of a prior inter-digitated capacitor structure.
Figure 5:
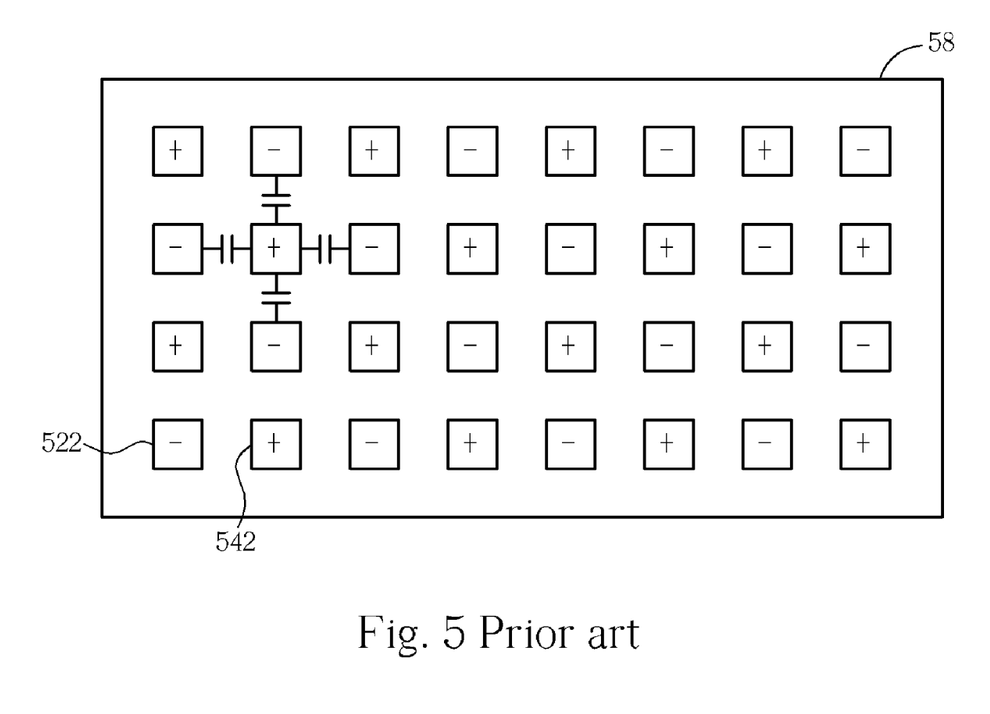
FIG. 5 is a schematic sectional diagram of the prior inter-digitated capacitor structure, taken across section V-V of FIG. 4.

The prior inter-digitated capacitor structure has another embodiment. Please refer to FIGS. 4-5. FIG. 4 is a schematic external diagram of a prior inter-digitated capacitor structure 50. FIG. 5 is a schematic sectional diagram of the prior inter-digitated capacitor structure 50, taken across sections V-V of FIG. 4. As FIGS. 4-5 show, the prior inter-digitated capacitor structure 50 consists of a first electrode structure and a second electrode structure. The first electrode structure comprises a plurality of first metal patterns 52 stacked vertically with respect to each other. The second electrode structure comprises a plurality of second metal patterns 54 stacked vertically with respect to each other. In addition, each first metal pattern 52 comprises a first peripheral part 521 and a plurality of first finger parts 522 connected with the first peripheral part 521. Each second metal pattern 54 comprises a second peripheral part 541 and a plurality of second finger parts 542 connected with the second peripheral part 541. Furthermore, between each first metal pattern 52 and each second metal pattern 54 a capacitor dielectric layer 58 (not shown in FIG. 4) is disposed. The prior inter-digitated capacitor structure 50 further comprises a plurality of first connective plugs 60 disposed among the capacitor dielectric layers 58 between the first peripheral parts 521 of each first metal pattern 52, so every first metal pattern 52 electrically connects with each other. Additionally a plurality of second connective plugs 62 are disposed among the capacitor dielectric layers 58 between the second peripheral parts 541 of each second metal pattern 54, so every second metal pattern 54 electrically connects with each other.

As FIGS. 4-5 show, the difference between the inter-digitated capacitor structure of FIGS. 2-3 and the inter-digitated capacitor structure of FIGS. 4-5 is that the first electrode structure of the inter-digitated capacitor structure 50 is mismatched with the second electrode structure. Therefore, a first finger part 522 combined with four second finger parts 542 that are respectively adjacent to the first finger part 522 will form a capacitor.

Compared with the MIM capacitor structure, the inter-digitated capacitor structure has better capacitance while it maintains the same size. The capacitance, however, is not the only consideration of the capacitor structure. Because the finger parts of the inter-digitated capacitor structure have longer lengths, and the finger parts are only connected electrically on one side, the resistance is correspondingly high, and the matching of the inter-digitated capacitor structure needs to be improved.

SUMMARY OF THE INVENTION

It is therefore one objective of the claimed invention to provide a three-dimensional capacitor structure having a low resistance, and high matching.

In one aspect of the claimed invention a three-dimensional capacitor structure is provided. The three-dimensional capacitor structure has a first conductive layer, a second conductive layer disposed above the first conductive layer, and a plug layer disposed therebetween. The first conductive layer is divided into a plurality of grid units arranged in a matrix. The first conductive layer comprises a plurality of first conductive grids and a plurality of first square holes. In the grid units of odd rows, the first conductive grids are disposed in the grid units of odd columns, and the first square holes are disposed in the grid units of even columns. In the grid units of even rows, the first conductive grids are disposed in the grid units of even columns, and the first square holes are disposed in the grid units of odd columns.

A centre of each first square hole further comprises a first conductive island, and each first conductive island is not connected electrically with the first conductive grids. The second conductive layer is divided into a plurality of grid units corresponding to the grid units of the first conductive layer. The second conductive layer comprises a plurality of second conductive grids and a plurality of second square holes. In the grid units of odd rows, the second conductive grids are disposed in the grid units of even columns, and the second square holes are disposed in the grid units of odd columns. In the grid units of the even rows, the second conductive grids are disposed in the grid units of odd columns, and the second square holes are disposed in the grid units of even columns. A centre of the second square holes further comprises a second conductive island, and each second conductive island being not connected electrically with the second conductive grids. The plug layer comprises a plurality of plugs, where each plug is located individually between each first conductive island and each second conductive grid, and between each first conductive grid and the second conductive island.

These and other objectives of the present invention will no doubt become obvious to those of ordinary skill in the art after reading the following detailed description of the preferred embodiment that is illustrated in the various figures and drawings.

DETAILED DESCRIPTION

Figure 6:
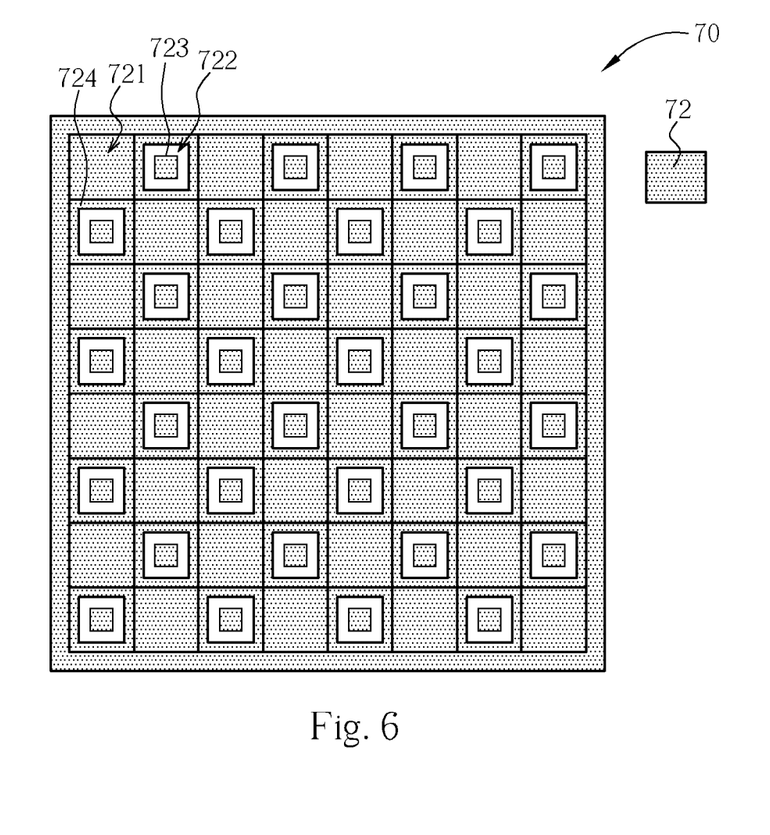
FIGS. 6-8 are schematic layout diagrams of a three-dimensional capacitor structure of an embodiment according to the present invention.
Figure 7:
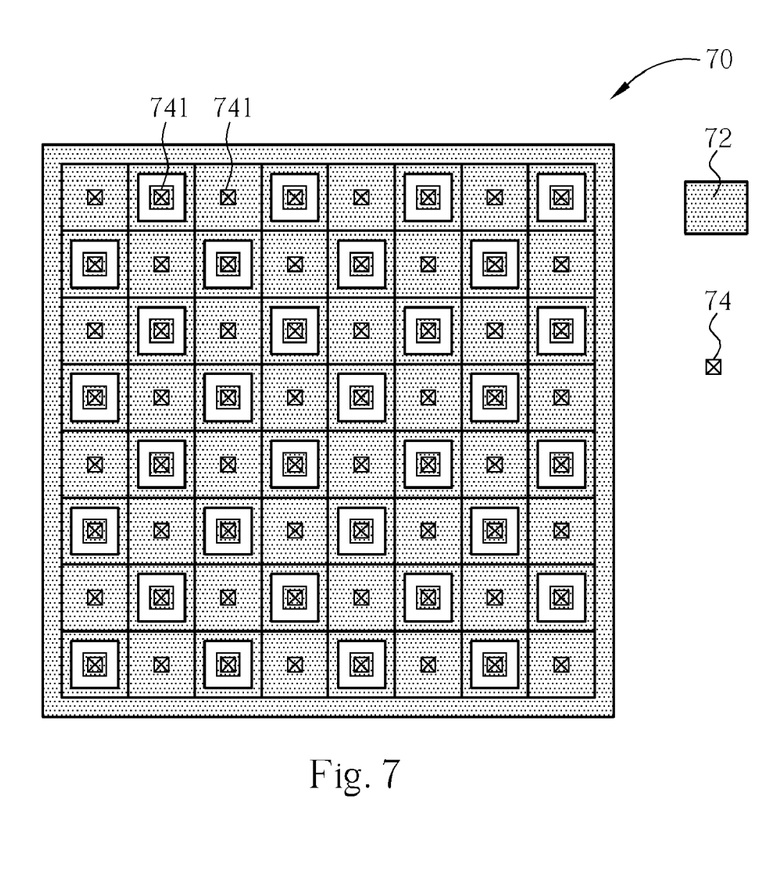
Figure 8:
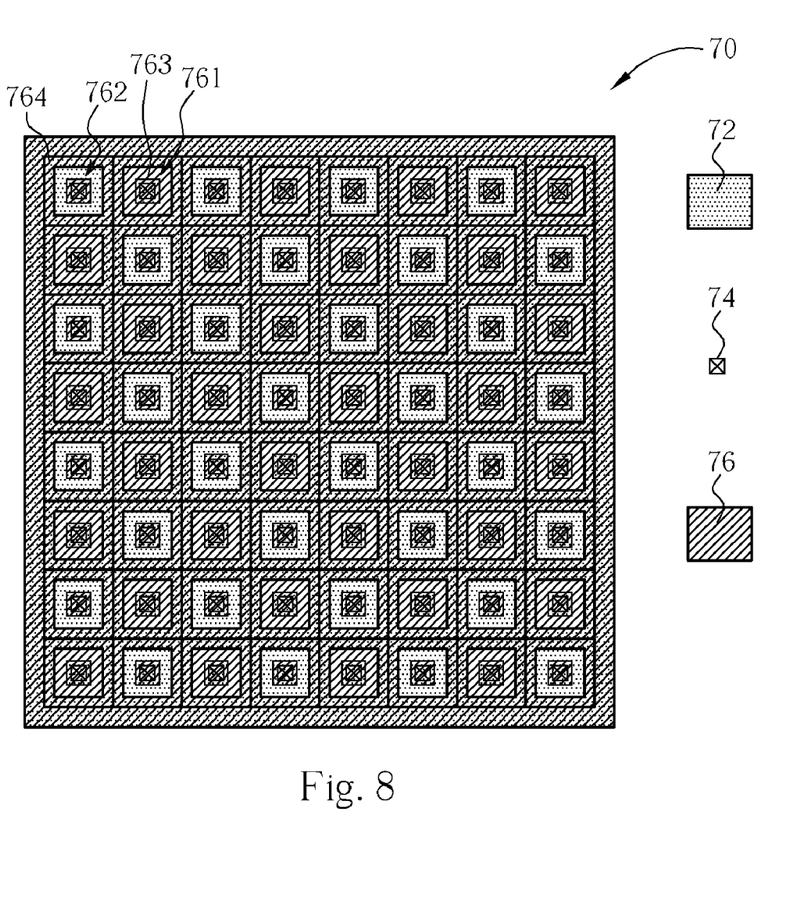

Please refer to FIGS. 6-8. FIGS. 6-8 are schematic layout diagrams of a three-dimensional capacitor structure of an embodiment according to the present invention. As FIG. 6 shows, the three-dimensional capacitor structure 70 comprises a first conductive layer (a first metal layer) 72, which is divided into a plurality of grid units arranged in a matrix. The first conductive layer 72 comprises a plurality of first conductive grids 721 and a plurality of first square holes 722. In odd rows of the grid units, the first conductive grid 721 is disposed in an odd column of the grid unit, and the first square hole 722 is disposed in an even column of the grid unit. In even rows of the grid unit, the first conductive grid 721 is disposed in an even column of the grid unit, and the first square hole 722 is disposed in an odd column of the grid unit. The centre of each first square hole 722 further comprises a first conductive island 723, where each first conductive island 723 does not connect electrically with a first conductive grid 721. Each the grid unit of even column in the odd row and each grid unit of the odd column in the even row further comprise a first conductive ring 724. Each first conductive ring 724 surrounds the corresponding first square hole 722, and connects with the first conductive grid 721 to increase the capacitance.

As FIG. 7 shows, the three-dimensional capacitor structure 70 further comprises a first plug layer 74 stacked above the first conductive layer 72. The first plug layer 74 comprises a plurality of plugs 741, where each plug 741 is individually disposed on each first conductive island 723 and each first conductive grid 721.

As FIG. 8 shows, the three-dimensional capacitor structure 70 comprises a second conductive layer (a second metal layer) 76 stacked on the first plug layer 74, and the second conductive layer 76 is divided into a plurality of grid units corresponding to the grid units of the first conductive layer 72. The second conductive layer 76 comprises a plurality of second conductive grids 761 and a plurality of second square holes 762. In addition, in odd rows of the grid units the second conductive grids 761 are disposed in the even columns of the grid units, and the second square holes 762 are disposed in the odd columns of the grid units. In even rows of the grid units the second conductive grids 761 are disposed in the odd columns, and the second square holes 762 are disposed in the even columns. Furthermore, the centre of each second square hole 762 comprises a second conductive island 763, where each second conductive island 763 does not connect electrically with each second conductive grid 761. In the same way as before, each the grid unit of odd column in the odd row and each grid unit of even column in the even row further comprise a second conductive ring 764. Each second conductive ring 764 surrounds the corresponding second square hole 762, and connects with the second conductive grid 761 to increase the capacitance.

Furthermore, in this embodiment, the horizontal cross-sectional areas of each first conductive island 723 and each second conductive island 763 are slightly larger than the horizontal cross-sectional areas of each plug 741. The horizontal cross-section areas of the first conductive island 723, the second conductive island 763, and the plug 741 can change depending on the required capacitance and the manufacturing limitations. A capacitor dielectric layer (not shown) is disposed between the first conductive layer 72 and the first plug layer 74, and the first plug layer 74 and the second conductive layer 76.

To sum up the aforementioned embodiments, the total capacitance of the three-dimensional capacitor structure in the present invention is the sum of the horizontal capacitance in the horizontal direction and the vertical capacitance in the vertical direction. The horizontal capacitance is a result of the capacitances between the first conductive grid 721 and the first conductive island 723, the capacitances between the second conductive grid 761 and the second conductive island 763, and the capacitance between the plugs 741. The three-dimensional capacitor structure comprises a vertical capacitance, which is a result of a capacitance between the first conductive ring and the second conductive grid, and a capacitance between the second conductive ring and the first conductive grid.

The above-mentioned first conductive layer 72, the first plug layer 74, and the second conductive layer 76 form the basic unit of the three-dimensional capacitor structure 70 in the present invention. The first conductive layer 72 and the second conductive layer 76 are supplied with different voltages, for example they individually connect with a positive voltage and a negative voltage. Furthermore, in real application, the three-dimensional capacitor structure 70 of the present invention is not limited to the above-mentioned three stacked structures, and can be altered depending on the capacitance or the layers of the metal interconnection. For example, the three-dimensional capacitor structure in the present invention can change to consist of five conductive layers and four plug layers.

Figure 9:
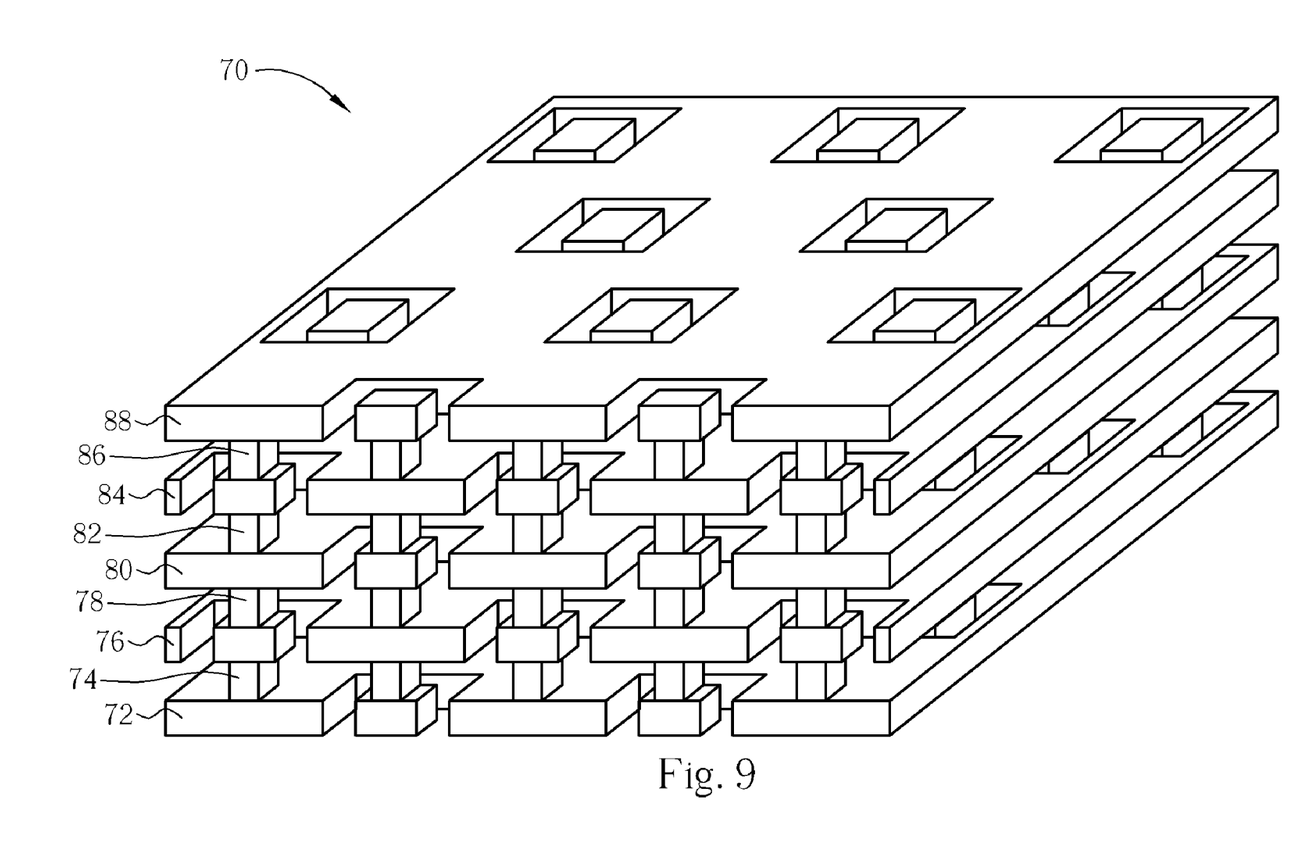
FIG. 9 is a schematic diagram of a three-dimensional capacitor structure of an embodiment according to the present invention.
Figure 10:
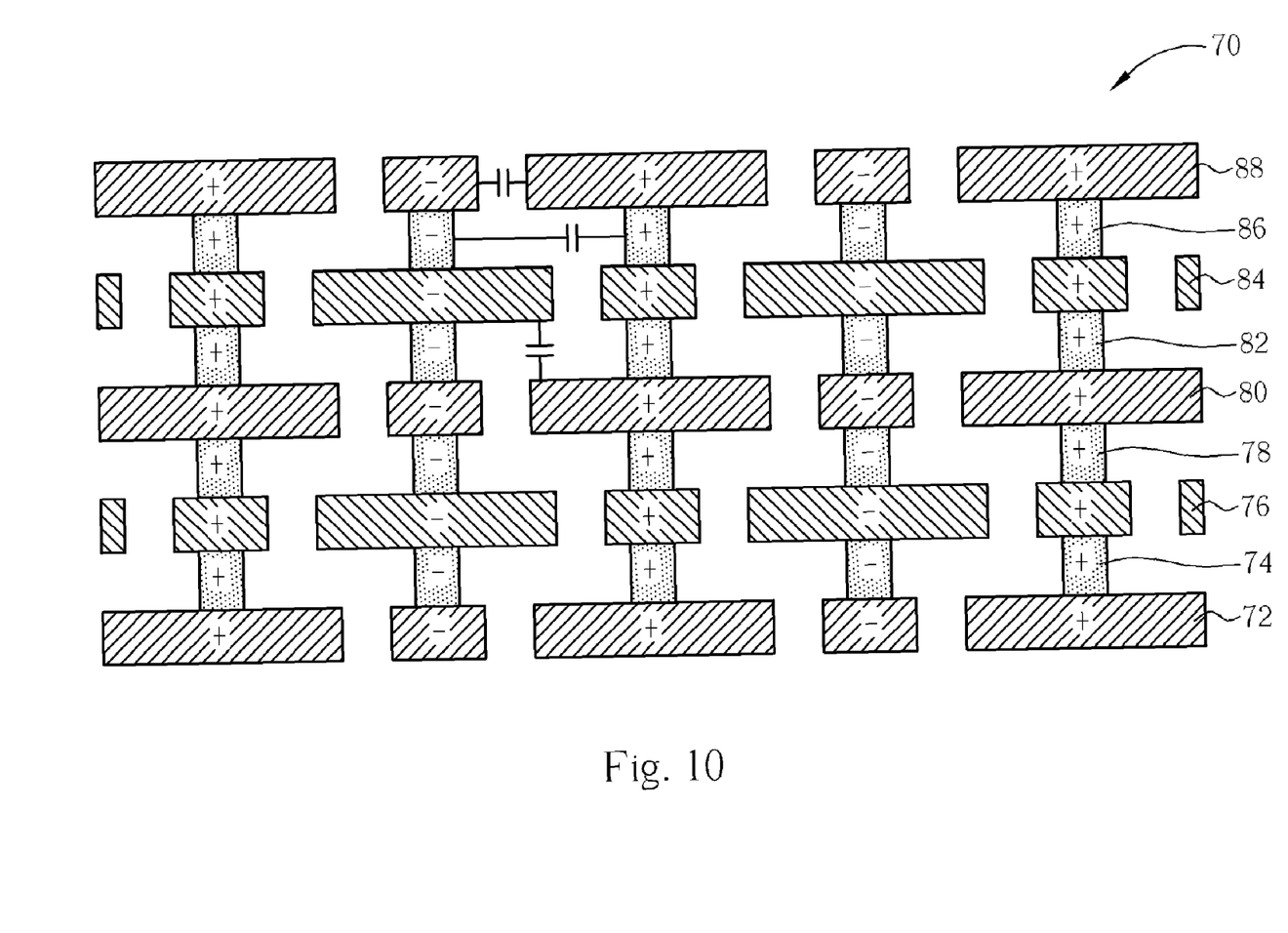
FIG. 10 is a schematic sectional diagram of the three-dimensional capacitor structure, taken across section X-X of FIG. 9.

Please refer to FIGS. 9-10. FIG. 9 is a schematic diagram of a three-dimensional capacitor structure of another embodiment according to the present invention. FIG. 10 is a schematic sectional diagram of the three-dimensional capacitor structure, taken across section X-X of FIG. 9. The embodiment takes as an example a three-dimensional capacitor structure made from five conductive layers and four plug layers. As FIG. 9 shows, a three-dimensional capacitor structure 70 comprises (from bottom to top) a first conductive layer 72, a first plug layer 74, a second conductive layer 76, a second plug layer 78, a third conductive layer 80, a third plug layer 82, a fourth conductive layer 84, a fourth plug layer 86, and a fifth conductive layer 88. Additionally, there are capacitor dielectric layers (not shown) among each layer. As FIG. 9 shows, a three-dimensional capacitor structure 70 is manufactured by stacking. The conductive grids of an odd conductive layer and the conductive islands of an even conductive layer are connected electrically by plugs. The conductive grids of an even conductive layer and the conductive island of an odd conductive layer are also connected electrically by the plugs. As FIG. 10 shows, when the odd conductive layer and even conductive layer individually connect with different voltages, the three-dimensional capacitor structure 90 is utilized as a capacitor. The total capacitance is the sum of the horizontal capacitance in the horizontal direction and the vertical capacitance in the vertical direction. The horizontal capacitance is the capacitance between the same level conductive grid and the conductive island (equal to the capacitance between the first conductive grid 721 and the first conductive island 723, and between the second conductive grid 761 and the second conductive island 763, as shown in FIGS. 6-8) added to the capacitance between the same level plugs (e.g. the plug 741 in FIG. 7). The vertical capacitance is a result of the capacitance between a different level conductive grid and an adjacent conductive grid (e.g. the capacitance between the first conductive ring 724 and the second conductive grid 761, and the capacitance between the second conductive ring 764 and the first conductive grid 721).

In conclusion, the three-dimensional capacitor structure in the present invention has low resistance, high matching, and high capacitance, and effectively improves the integration of the integrated circuits. Please note that the present invention is not limited to the above-mentioned embodiments, and can be modified appropriately. For example, the horizontal cross-sections of the plug, the conductive grid or the conductive island are not limited to being a square shape; they could be circular, square, rectangular, or polygonal, under different demands of the capacitor and manufacturing conditions. The conductive ring could be circular, rectangular, or a polygonal ring. Moreover, the material of the conductive layer can be selected from metal, poly-silicon or semiconductor etc. according to the electrical performance, and the capacitor dielectric layer could be selected from materials under the demand of the capacitance. The corresponding position of the conductive grid and the conductive island of each conductive layer could be modified appropriately, and is not limited to the above-mentioned embodiments.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional capacitor structure, comprising:
   a first conductive layer, divided into a plurality of grid units arranged in a matrix, the first conductive layer comprising a plurality of first conductive grids and a plurality of first square holes, and in the grid units of odd rows, the first conductive grids being disposed in the grid units of odd columns, and the first square holes being disposed in the grid units of even columns, and in the grid units of even rows, the first conductive grids being disposed in the grid units of even columns, and the first square holes being disposed in the grid units of odd columns, a centre of each first square hole further comprising a first conductive island, and each first conductive island being not connected electrically with the first conductive grids;
   a second conductive layer, disposed above the first conductive layer, divided into a plurality of grid units corresponding to the grid units of the first conductive layer, the second conductive layer comprising a plurality of second conductive grids and a plurality of second square holes, and in the grid units of odd rows, the second conductive grids being disposed in the grid units of even columns, the second square holes being disposed in the grid units of odd columns, and in the grid units of the even rows, the second conductive grids being disposed in the grid units of odd columns, and the second square holes being disposed in the grid units of even columns, a centre of the second square holes further comprising a second conductive island, and each second conductive island being not connected electrically with the second conductive grids; and
   a plug layer, disposed between the first conductive layer and the second conductive layer, the plug layer comprising a plurality of plugs, where each plug is located individually between each first conductive island and each second conductive grid, and between each first conductive grid and the second conductive island.

2. The three-dimensional capacitor structure of claim 1, wherein the horizontal cross-sectional area of each first conductive island is slightly greater than the horizontal cross-sectional area of each plug.

3. The three-dimensional capacitor structure of claim 1, wherein the horizontal cross-sectional area of each second conductive island is slightly greater than the horizontal cross-sectional area of each plug.

4. The three-dimensional capacitor structure of claim 1, wherein the three-dimensional capacitor structure comprises a horizontal capacitance, which is generated by the sum of a capacitance between the first conductive grid and the first conductive island, a capacitance between the second conductive grid and the second conductive island, and a capacitance between the plugs.

5. The three-dimensional capacitor structure of claim 1, wherein each grid unit in even columns of odd rows, and each grid unit in odd columns of even rows further comprise a first conductive ring, and each first conductive ring surrounds each corresponding first square hole, and connects with the first conductive grids.

6. The three-dimensional capacitor structure of claim 1, wherein each grid unit in odd columns of odd rows, and each grid unit in even columns of even rows further comprise a second conductive ring, and each second conductive ring surrounds each corresponding second square hole, and connects with the second conductive grids.

7. The three-dimensional capacitor structure of claim 6, wherein the three-dimensional capacitor structure comprises a vertical capacitance, and the vertical capacitance is generated by a capacitance between the first conductive rings and the second conductive grids, and a capacitance between the second conductive rings and the first conductive grids.

* * * * *

UNITED STATES PATENT AND TRADEMARK OFFICE
CERTIFICATE OF CORRECTION

PATENT NO. : 7,298,001 B2
APPLICATION NO. : 11/468296
DATED : November 20, 2007
INVENTOR(S) : Li-Kuo Liu et al.

Page 1 of 1

It is certified that error appears in the above-identified patent and that said Letters Patent is hereby corrected as shown below:

On the Title Page, Item (65), Prior Publication Data, the Prior Publication Data should be --US 2007/0187739 A1    Aug. 16, 2007--

Signed and Sealed this

Fifteenth Day of April, 2008

JON W. DUDAS
*Director of the United States Patent and Trademark Office*